United States Patent
Sweet (12)

(10) Patent No.: US 6,350,555 B1
(45) Date of Patent: Feb. 26, 2002

(54) DIRECT WRITE IMAGING MEDIUM

(75) Inventor: Norman Sweet, Waterford, MI (US)

(73) Assignee: Precision Coatings, Inc., Walled Lake, MI (US)

( * ) Notice: Subject to any disclaimer, the term of this patent is extended or adjusted under 35 U.S.C. 154(b) by 0 days.

(21) Appl. No.: 09/229,182

(22) Filed: Jan. 13, 1999

Related U.S. Application Data (60) Provisional application No. 60/071,413, filed on Jan. 14, 1998.

(51) Int. Cl.⁷ .................................................. G03F 7/11
(52) U.S. Cl. ............................... 430/271.1; 430/273.1; 430/275.1
(58) Field of Search ................. 430/200, 201, 430/156, 158, 162, 4, 5, 271.1, 273.1, 275.1

(56) References Cited

U.S. PATENT DOCUMENTS

| | | | | |
|---|---|---|---|---|
| 3,744,904 A | * | 7/1973 | Loprest et al. | 430/5 |
| 3,892,571 A | * | 7/1975 | Simeonov et al. | 430/5 |
| 4,000,334 A | | 12/1976 | Hallman et al. | 427/56 |
| 4,149,888 A | * | 4/1979 | Loprest | 430/5 |
| 4,211,838 A | | 7/1980 | Izu et al. | 430/502 |
| 4,309,713 A | | 1/1982 | Shinozaki et al. | 346/135.1 |
| 5,124,227 A | | 6/1992 | Hodgins et al. | 430/162 |
| 5,256,506 A | | 10/1993 | Ellis et al. | 430/20 |
| 5,521,050 A | | 5/1996 | Henzel et al. | 430/269 |
| 5,593,808 A | | 1/1997 | Ellis | 430/261 |
| 5,612,165 A | | 3/1997 | Ellis | 430/201 |
| 5,681,681 A | | 10/1997 | Ellis | 430/201 |
| 5,747,197 A | | 5/1998 | Sweet | 430/5 |
| 5,766,819 A | | 6/1998 | Blanchet-Fincher | 430/201 |
| 5,858,604 A | * | 1/1999 | Takeda et al. | 430/162 |

FOREIGN PATENT DOCUMENTS

| | | |
|---|---|---|
| EP | 0 470 707 A2 | 2/1992 |
| EP | 0 480 703 A2 | 4/1992 |
| WO | WO 97/20252 | 6/1997 |

* cited by examiner

*Primary Examiner*—John S. Chu
(74) *Attorney, Agent, or Firm*—Gifford, Krass, Groh, Sprinkle, Anderson & Citkowski, P.C.

(57) ABSTRACT

A direct write imaging film includes a first layer disposed on a substrate and a second layer atop the first layer. The first layer is capable of being dispersed or otherwise disrupted by a first wavelength of light so as to decrease the adhesion of the second layer to the remainder of the film. The second layer has a relatively strong absorption for a second wavelength of light which is shorter than the first wavelength. In the use of the film, light of the first wavelength is used to disrupt selected portions of the first layer; and then, overlying portions of the second layer are removed to produce an image which is strongly absorbing of the second wavelength, and is defined by the remaining portions of the second layer.

19 Claims, 4 Drawing Sheets

DIRECT WRITE IMAGING MEDIUM

RELATED APPLICATION

This patent applications claims priority of provisional patent application Ser. No. 60/071,413 filed Jan. 14, 1998 and entitled "Direct Write Imaging Medium."

FIELD OF THE INVENTION

This invention generally relates to photo responsive materials and methods for their use. More specifically, the invention relates to a direct write imaging film which is capable of having an image formed directly thereupon by a beam of light, without the use of any photo mask or negative.

BACKGROUND OF THE INVENTION

Photo lithographic and/or photo etch techniques are widely used in the fabrication of printed circuit boards, semiconductor devices, the preparation of printing plates, and a number of other such processes. Such photo techniques generally employ one or more masks, also referred to as phototools. The phototool is used as a master in the exposure of other photosensitive materials. In general, materials used for phototools should have very high resolution and should be capable of presenting a high contrast image at imaging wavelengths. That is to say, the phototool material should have an image area which is highly absorbing of imaging wavelengths, and a background area which is highly transparent at imaging wavelengths.

A number of different media have been employed for the fabrication of photo masks. One group of materials comprises direct write media. In such materials, a beam of light, generally a high intensity beam of light from a laser, is scanned across a film so as to directly form an image thereupon. Systems of this type are advantageous insofar as they can be easily interfaced with computerized data storage and processing systems. Furthermore, the imaging media of this type generally have relatively low sensitivity to ambient illumination, and may be handled under normal room light.

Several different types of direct write films are known in the prior art. One group of films comprises ablation imaging films. In these materials, a high intensity beam of light, typically from a laser, impacts a body of imaging material and causes physical removal of the material by volatilization. One such process is shown in U.S. Pat. No. 5,521,050. Another direct write imaging film in which a beam of light ablates or degrades an imaging dye is shown in U.S. Pat. No. 5,747,197. A somewhat similar approach is shown in U.S. Pat. No. 5,256,506. As disclosed therein, a layer of light absorbing, ablatable dye-containing material is disposed atop a layer of ablation enhancing material. Both layers are highly absorbing of the beam of imaging light, and the layer of ablation enhancing material increases the sensitivity of the imaging medium by driving the volatilized dye-containing layer away from the film. While ablation imaging films are in wide use, the volatilization of a relatively thick layer of imaging material produces a significant volume of effluents which may be toxic, and in any event must be cleaned from the imaging apparatus.

Another approach to providing a direct write medium involves the use of photodispersable materials. In imaging films of this type, a layer of meltable material, typically a layer of metal, is disposed upon a substrate in a continuous sheet. A beam of light is impinged onto the layer and causes it to melt. The melted layer draws up into droplets through surface tension thereby lowering the optical density of the imaged area. In order to provide sufficient optical density in the nondispersed areas, these films generally require relatively thick layers of metal; hence, fairly large energy fluxes are required to cause dispersion. Examples of such imaging materials are found in U.S. Pat. No. 4,000,334 and U.S. Pat. No. 4,211,838.

There is a need for a direct write imaging film which has high resolution and high contrast, and which does not generate significant amounts of volatile material in its use. In addition, the imaged film should have very good dimensional stability and should be resistant to scratching, cracking and fading under ambient handling conditions.

The present invention provides a direct write imaging film which meets all of the foregoing criteria. The direct write imaging film of the present invention does not require any wet chemical processing, and may be used under ambient light conditions, and it is readily adaptable for use in computer controlled imaging systems of the type wherein a laser or similar light source is controlled so as to directly write upon a film. The imaged film of the present invention has a very high DMax and a very low DMin in the UV portions of the spectrum, but is highly transparent in both the image and background areas, at visible wavelengths. This produces a "see-through image" having high contrast at UV wavelengths. This combination of transparencies makes the material of the present invention very useful as a phototool or photo mask material, since the see-through feature allows for ready alignment of the phototool, while the strong UV absorption produces a high contrast image.

As will be explained in further detail hereinbelow, the imaged areas of the film are highly resistant to fading or photo bleaching. The imaging medium is highly resistant to scratching or chemical damage; therefore, overlamination is not necessary. The imaging species of the present invention is molecular, and not particulate; therefore, high resolution is achieved. The materials of the present invention do not require any chemical processing, special ventilation, or special handling.

BRIEF DESCRIPTION OF THE INVENTION

There is disclosed herein a direct write imaging film which includes a substrate having a first layer of a first material disposed thereupon and a second layer of a second material disposed in a superposed relationship with the layer of first material. The first layer has a higher absorbance for a first wavelength of light than it does for a second wavelength of light, which second wavelength of light is shorter than the first. The second layer has a lower absorbance for the first wavelength of light than does the first layer, and a higher absorbance for the second wavelength of light than does the first layer. The material of the first layer is capable of being disrupted by the first wavelength of light, and when it is, the adherence of the overlying portions of the second layer to the remainder of the imaging film is decreased so that those portions of the second layer which overlie the disrupted regions in the first layer are readily removable from the remainder of the imaging film.

In particular embodiments, the layer of first material comprises a layer of metal. In yet other embodiments, the layer of second material includes an ultraviolet absorbing dye therein. In specific embodiments, the ultraviolet absorbing dye is a member of a particular group of azo dyes.

In some embodiments, a heat dispersing layer is interposed between the first layer and the second layer. In other embodiments, a body of adhesive material is disposed atop the second layer, and this body of adhesive material functions to lift away portions of the second layer which overlie disrupted portions of the first layer.

Also disclosed herein is a method of preparing a phototool which method involves the use of the direct write imaging film of the present invention.

DETAILED DESCRIPTION OF THE INVENTION

Figure 1:
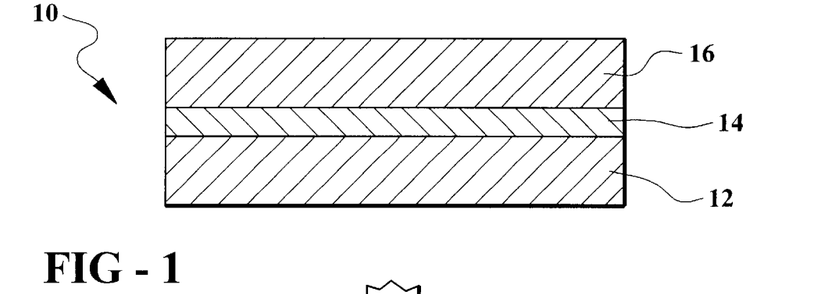
FIG. 1 is a cross-sectional view of an imaging medium structured in accord with the principles of the present invention.

The present invention is directed to a direct write imaging medium, and to methods for its use. FIG. 1 depicts a cross-sectional view of an imaging medium 10 structured in accord with the principles of the present invention. The medium 10 of FIG. 1 includes a substrate 12, which is typically formed from a material having good transparency in visible and ultraviolet portions of the spectrum; and in some embodiments, the substrate is also relatively transparent in the near infrared portions of the spectrum. The substrate should be dimensionally stable and compatible with the remaining layers of the medium. In most instances, a flexible substrate material is preferred, and one particularly preferred group of substrate materials comprises polyester materials such as polyethylene terepthalate (PET). Other substrates comprise rigid polymers, glass and the like.

Disposed atop the substrate 12 is a first layer of material 14, and atop that is a second layer of material 16. The materials of the first layer 14 and the second layer 16 are selected so that the material of the first layer has a higher optical absorbance for a first wavelength of light than it does for a second wavelength of light which is shorter than the first wavelength. Also, the material comprising the second layer 16 is selected so that it has a lower absorbance for the first wavelength of light than does the material of the first layer, and it has a higher absorbance for the shorter, second wavelength of light than does the material comprising the first layer 14. More specifically, the material of the first layer 14 is selected so that it has a relatively high absorption for wavelengths of light in the infrared, near infrared and red portions of the spectrum, but is relatively transparent to a majority of the visible spectrum. In addition, the material of the first layer 14 is capable of being dispersed or otherwise disrupted upon absorption of light. The material of the second layer 16 is selected so that it is highly absorbing of ultraviolet radiation, but is relatively transparent to the visible portions of the spectrum. Some specific examples of materials for the layers will be presented hereinbelow.

Figure 2:
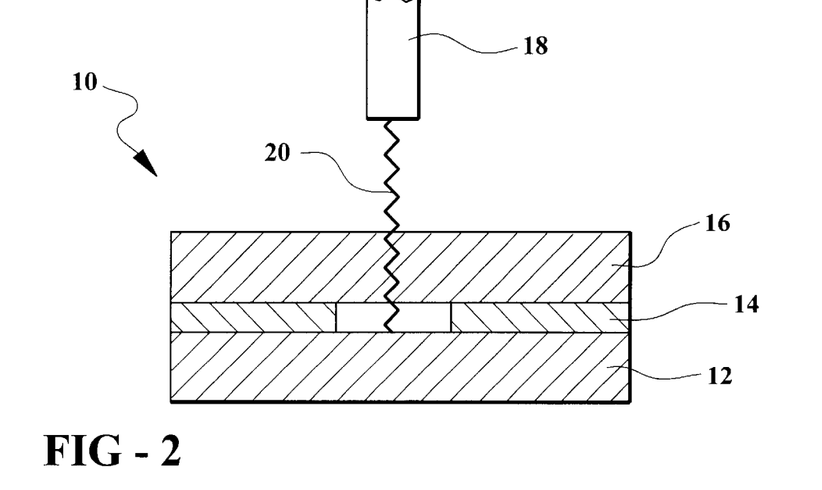
FIG. 2 is a cross-sectional view showing a first step in the imaging of the medium of FIG. 1.
Figure 3:
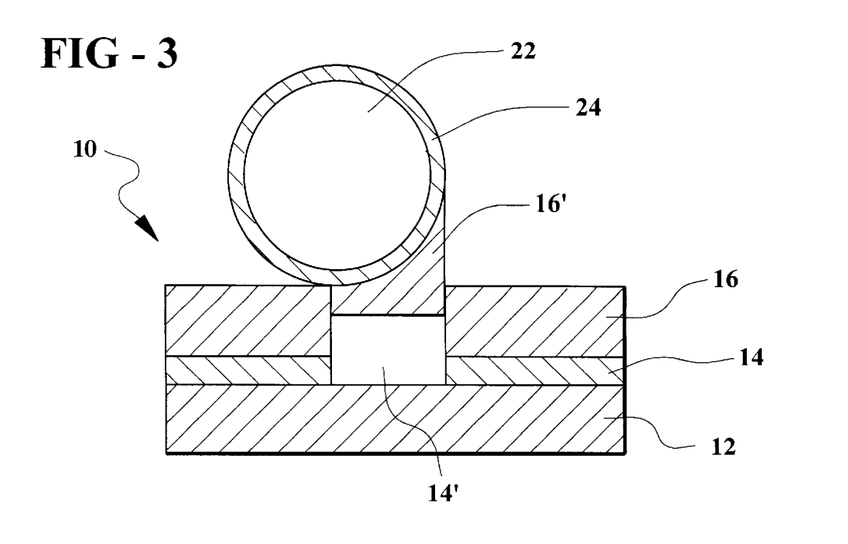
FIG. 3 is a cross-sectional view showing a second step in the imaging of the medium of FIG. 1.

The unique combination of absorption properties of the various layers makes possible the present invention. Referring now to FIG. 2 and FIG. 3, there is shown one particular implementation of the present invention. FIG. 2 depicts the first stage in an imaging process wherein a body of direct write medium 10, which is generally similar to the body 10 described in FIG. 1, is being written upon by a laser 18. As shown in FIG. 2, a laser 18 is disposed so as to direct a beam of light 20 onto the medium 10. The beam 20 has a relatively long wavelength, and is most preferably a beam of infrared radiation having a wavelength of approximately 1 micron as can be obtained from a number of commercially available lasers such as a YAG laser or the like. As described above, the second layer 16 is relatively transparent to long wavelength illumination, and hence the laser beam 20 passes therethrough relatively unimpeded. The first layer 14 is strongly absorbing of this infrared radiation, and as a result of absorption and thermal heating, the portions of the first layer 14 struck by the laser beam 20 are disrupted. Within the context of this disclosure, disruption of the layer refers to any process wherein the integrity of the layer 14 is destroyed. Most typically, laser heating melts, ablates or otherwise physically disperses the layer 14 so as to produce a disrupted region 14' containing layer residue in the form of dust, globules or the like. In other instances disruption may be accomplished by a chemical change in the layer, such as depolymerization chemical reactions such as oxidation, or the like.

Portions of the first layer 16 overlying the disrupted region 14' of the first layer 14 are no longer supported or retained, and hence may be readily removed. Referring now to FIG. 3, there is shown one method wherein the portions of the first layer 16 overlying the disrupted region 14' of the first layer 14 are removed. As shown in FIG. 3, a roller 22 having a slightly tacky, adhesive, exterior surface 24 is rolled across the top surface of the second layer 16 of the imaging medium 10. This slightly tacky roller adheres to, and removes only those portions 16' of the second layer 16 which directly overlie the disrupted region 14' of the first layer 14. In one preferred embodiment, the adhesive surface of the roller is provided by a body of relatively soft urethane polymer. In alternative embodiments, an adhesive layer or the like may be employed to provide a tacky surface. In yet other embodiments, a brush, a stream of compressed air or other fluid may be likewise employed to remove the unsupported portions of the second layer 16.

Disruption of the first layer can produce dust or other residue in the disrupted region 14'. Any residual dust or first layer residue will generally not interfere with subsequent use of the imaged body as a photo mask or phototool; although, such dust residue may accumulate in various apparatus, or otherwise present a nuisance. Therefore, it is often desirable to remove any residual dust. In some instances, removal of the portions of the second layer 16 will also suffice to remove any dust or other residue of the disrupted region 14' of the first layer 14. Dust may be removed through the use of conventional cleaning techniques, including brushing, rinsing with compressed gas stream, vacuum cleaning or the like.

Figure 4:
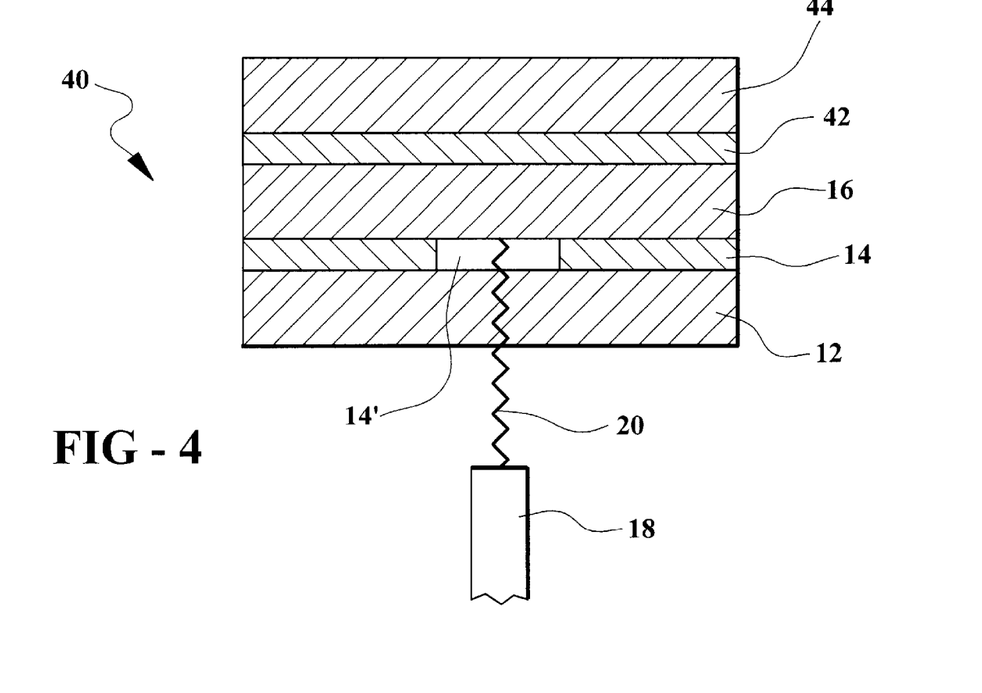
FIG. 4 is a cross-sectional view of another embodiment of imaging medium structured in accord with the principles of the present invention, and showing a first step in the imaging thereof.

The present invention may be implemented in other modes and configurations. Referring now to FIG. 4, there is shown another variation of imaging medium 40 in accord with the present invention. The medium 40 of FIG. 4 includes a substrate 12, a first layer 14 and a second layer 16, which are generally similar to those previously described. The medium 40 of FIG. 4 further includes a layer of low tack adhesive 42 disposed atop the second layer 16, and a support sheet 44 disposed atop the adhesive body 42. The adhesive 42 is selected to have a relatively low degree of adherence to the second layer 16, and such adhesives are well known in the art, and are widely employed for repositionable signage, adhesive memo notes, and the like. The layer of backing material 44 is most preferably a transparent sheet of flexible material to facilitate visibility and alignment of the body of imaging material 40 during use; although, opaque sheets could also be employed.

As shown in FIG. 4, a first step in forming an image on the body of material 40 comprises irradiating the medium 40 with a beam of light 20 from a laser 18 or similar high intensity source. This step is similar to the first step illustrated in FIG. 2; however, in this instance, irradiation takes place from the substrate side of the member, and the substrate should be relatively transparent to the beam 20. However, the second layer 16 need not be particularly transparent to the imaging beam 20. As in the FIG. 2 embodiment, irradiation produces a disrupted region 14' in the first layer 14. As in the foregoing example, the disrupted region 14' of the first layer underlies a corresponding portion of the second layer 16 and reduces the adherence of that portion of the second layer 16 to the remainder of the imaging medium.

Figure 5:
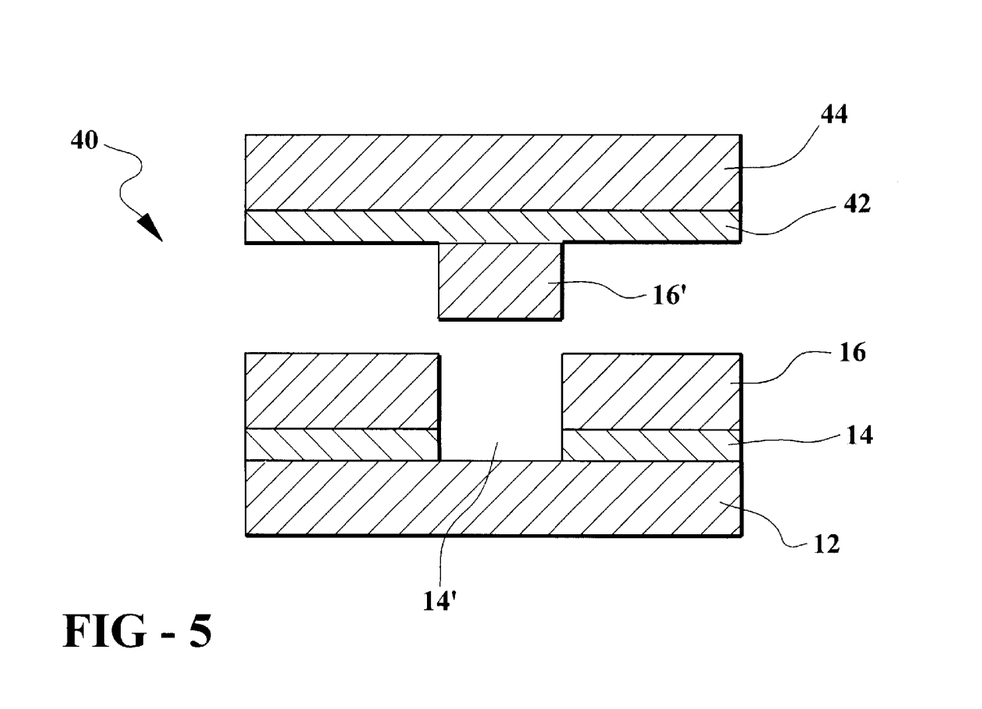
FIG. 5 is a cross-sectional view of the imaging medium of FIG. 4 showing a second step in the formation of an image thereupon.

In FIG. 5, there is shown a second step in the formation of an image. In this step, the adhesive layer 42 and its backing layer 44 are peeled away from the second layer 16, first layer 14 and substrate 12, which comprise the remainder of the body of imaging material 40. The adhesive 42 also carries away that portion 16' of the second layer 16 which overlies the disrupted region 14' of the first layer 14. The adhesive layer 42, backing layer 44 and removed portion 16' of the second layer are then discarded, and the remaining portion of the structure 40 comprises a photo mask or phototool which is ready for use. As in the foregoing example, it may, in some instances, be advantageous to remove any residue of the first layer 14 left in the disrupted region 14'.

Figure 6:
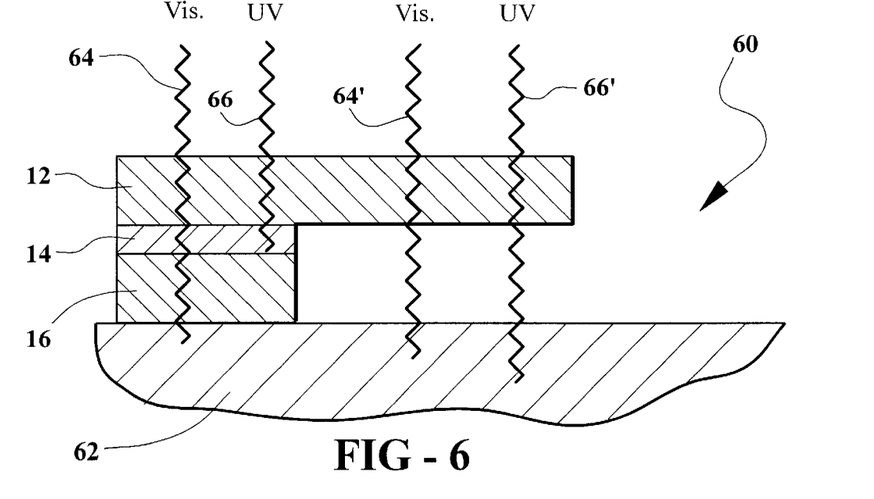
FIG. 6 is a schematic depiction of the imaging medium of the present invention, illustrating its use as a photo mask.

FIG. 6 depicts an imaged phototool manufactured in accord with the present invention being used in a subsequent application, and this figure illustrates the advantages of the present invention. FIG. 6 specifically shows a photo mask or phototool 60 prepared in accord with the present invention, as previously described. The phototool 60 includes a substrate portion 12, a first layer 14, and a second layer 16 as previously described. It will be noted that only a portion of the substrate 12 is covered by the first 14 and second 16 layers, the remaining portion thereof having been cleared of such layers by method steps generally similar to those previously described.

As further depicted, the phototool 60 is disposed upon a workpiece 62, a portion of which is shown herein in broken away cross-section. This workpiece 62 will comprise an emulsion or other photo responsive composition. It is a notable feature of the present invention that the image side thereof has sufficient integrity so as to allow it to be directly contacted through the workpiece 62. This is known in the art as emulsion to emulsion contact, and it is differentiated from those prior art systems which require that the substrate portion of the phototool or mask be placed in contact with the workpiece, or that a protective overcoat be present between the image and the workpiece 62. Emulsion to emulsion contact eliminates the problems of diffraction and parallax, which will degrade resolution. It is also to be noted that the vertical thickness of the various layers is exaggerated in the present drawings, for purposes of illustration. In a typical composition, the aggregate thickness of the first and second layers of materials in accord with the present invention will be in the order of one-half to ten microns.

FIG. 6 further illustrates the interaction of the material of the present invention with beams of visible light 64 and beams of ultraviolet light 66. As shown, the substrate 12, first layer 14 and second layer 16 are all relatively transparent to a major portion of the visible spectrum 64. Therefore, the image bearing portions of the phototool 60 are relatively transparent to the eye. This is referred to as a see-through image, and this feature facilitates positioning and alignment of the phototool 60 onto the substrate 62. The image portion of the phototool constituting the first 14 and second 16 layers is highly absorbing of short wavelength UV, and near UV radiation 66 and therefore efficiently and effectively masks the substrate 62 from such UV radiation 66. In contrast, the nonimage bearing portions of the phototool 60 include only the substrate 12 (and possibly disrupted portions of the first layer 14), and are relatively transparent to UV radiation 66, and allow such radiation to pass therethrough and interact with the substrate 62.

While the aforedescribed imaging media produce high quality, high resolution images suitable for most phototool uses, in some instances it has been found that particular artifacts and defects occur in the imaging process, and these defects may be problematic, particularly for very high resolution applications. Therefore, in accord with the present invention there is further provided a specific imaging structure which greatly minimizes such defects.

Figure 7:
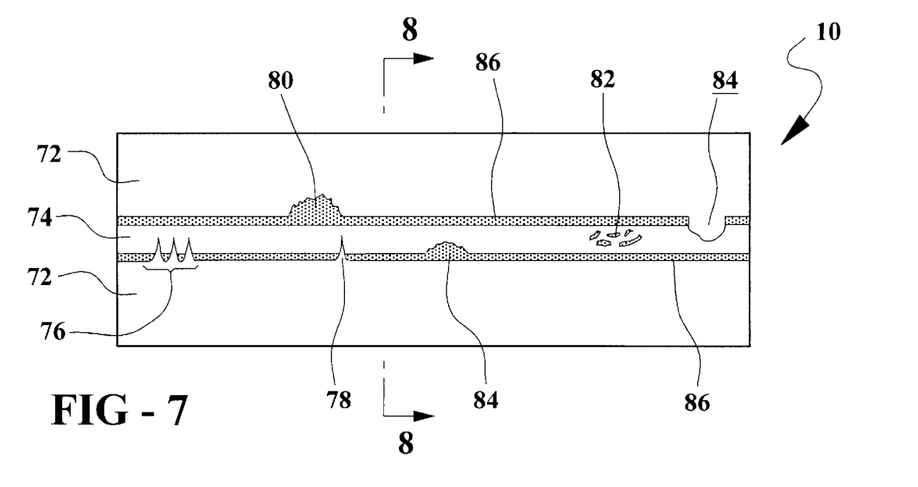
FIG. 7 is a top plan view of a portion of an imaging film of the present invention illustrating particular microscopic defects in the image portion thereof.

Referring now to FIG. 7, there is shown a top plan view of a greatly enlarged portion of an imaging film 10, generally similar to the film shown in FIG. 1. The film 10 has an imaged area 72 which is defined by the presence of the dye bearing, second layer thereupon. The film also includes a background area 74 configured as a thin stripe running the length of the film, and defined by portions of the film having the first and second layers removed therefrom. Visible in the FIG. 7 illustration are a number of defect regions, and it is to be understood that the frequency of such defect regions has been exaggerated for purposes of illustration, and as a practical matter, the occurrence is generally much less frequent. The illustrated defects include a region of scalloping 76 wherein portions of the dye bearing image layer project into the background area; a spike 78, which is generally similar to the scallops 76. The defects also include a chipped region 80 wherein a portion of the second layer has flaked away from the first proximate the disrupted region. The defects also include globules of the first layer 82 resultant from incomplete dispersion, as well as a region of piled first layer material 84 which is formed when dispersed first layer material is thrown as a result of the dispersing illumination. Also visible in the FIG. 7 illustration is a bridged portion 84, which is generally the opposite of the chipped portion 80, and which results when a portion of the second layer is incompletely removed.

Another class of defects comprises a trapezoid edge which is formed when portions of the first layer material accumulate at the edge of a disrupted area. This type of defect produces a line running around the edge of an imaged area, and such defects are shown at reference numeral 86 in FIG. 7, and will be more clearly evident from FIG. 8, which is a cross-sectional view of the imaged film of FIG. 7 taken along lines 8—8.

Figure 8:
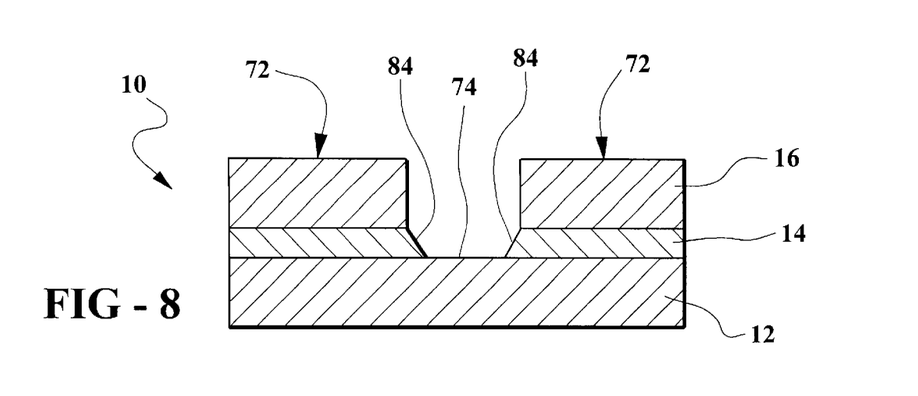
FIG. 8 is a cross-sectional view of the imaged film of FIG. 7 taken along lines 8—8.

Referring now to FIG. 8, there is shown a cross-sectional portion of the film 10 of FIG. 7 illustrating the trapezoid edge defect 84. While not wishing to be bound by speculation, the inventors hereof theorize that the trapezoid edge defect occurs when dispersed first layer material is thrown, and collects at edge regions. Such defects distort the geometry of the resultant phototool. The other enumerated defects are also thought to occur as a result of the thermal and/or mechanical effects of the dispersion process. In some instances such defects can be tolerated; but in other instances, they must be minimized.

In accord with yet another aspect of the present invention, it has been found that the aforementioned defects, particularly the trapezoid edge defect and chipping defects, can be eliminated or greatly minimized if a relatively thin undercoat layer is interposed between the photodispersable first layer and the second layer. While not wishing to be bound by speculation, it is theorized that this layer functions as a heat dispersing layer which moderates and equilibrates thermal effects thereby reducing the formation of the aforementioned defects.

Figure 9:
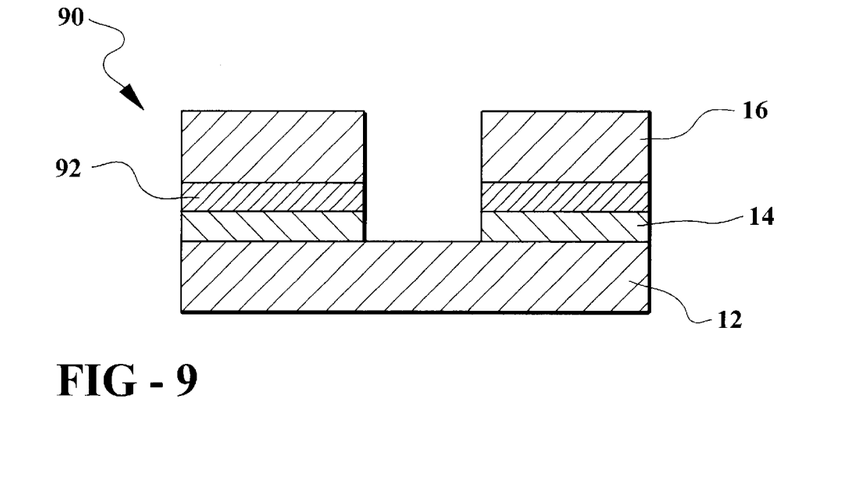
FIG. 9 is a cross-sectional view of another embodiment of imaging medium of the present invention which includes the heat diffusion layer therein.

Referring now to FIG. 9, there is shown a cross-sectional view of another imaging film 90 structured in accord with the principles of the present invention. The film 90 includes a substrate 12, first layer 14 and second layer 16 which are generally similar to those previously described. However, the film 90 of FIG. 9 further includes an undercoat layer 92 which functions as a heat dispersion layer, the inclusion of which minimizes defect formation in the imaged film. The undercoat layer 92 is typically fairly thin, and generally on the order of 1 to 5 microns in thickness. It is preferably formed from a polymeric material, and is relatively transparent to both the longer wavelength illumination used for the disruption of the first layer 14, the shorter wavelength illumination which is employed when the finished phototool is used, as well as visible wavelengths.

One preferred material for the fabrication of the undercoat layer comprises hydrolyzed polyvinyl acetate. One commercially available grade of hydrolyzed polyvinyl acetate having suitability for use in the present invention is available from Precision Coatings Inc. of Walled Lake, Mich. under the designation HPVA. It has been found that a 10% solution of this polymer cast from a fifty-fifty mixture of methanol and ethyl acetate provides a very good undercoat layer which minimizes the formation of defects. Another undercoat layer may be prepared from a hydrolyzed polyvinyl acetate polymer available from the Morton Chemical Company under the designation Morton Polymer 10. A 25% solution of this polymer in a mixture of 2 parts deionized water and 1 part isopropanol provides a very good undercoat layer.

The present invention may be implemented with a variety of different materials. As noted above, the substrate 12 should have a high degree of transparency for ultraviolet and visible radiation, and in those instances wherein illumination takes place through the substrate side, it should also be relatively transparent to the infrared and near infrared wavelengths used to induce disruption of the first layer 14. The substrate should also have good dimensional stability. In some instances, the substrate may be fabricated from a rigid material such as glass; although, in many instances, flexible substrates are desired. Therefore, the substrate is typically fabricated from a flexible polymeric material with good dimensional stability such as PET, polyimide, or the like.

The first layer is fabricated from a material which is relatively transparent to visible wavelengths, but has a high absorption for infrared and near infrared wavelengths. Furthermore, the material constituting this layer should be capable of being disrupted by absorbed infrared radiation. It has been found that the most preferable materials for the fabrication of this first layer comprise thin films of metals. A number of metals may be readily deposited onto substrates by techniques such as vacuum evaporation, sputtering and the like, at controlled thicknesses. If made sufficiently thin, the layers are highly transparent to visible wavelengths, but are still very absorbing of infrared radiation. Furthermore, infrared radiation will cause thin metal layers to photo disperse and lose their integrity. There are a variety of metals which may be employed as the first layer in the practice of the present invention. Selection of an appropriate material will depend upon adhesion of the material to the substrate and to the overlying second layer, as well as stability of the material to atmospheric conditions, and to the remaining components of the imaging medium. One particularly preferred material for the first layer of the present invention comprises titanium. Other metals such as bismuth, nickel, vanadium, chromium, molybdenum and the like may be similarly employed. Typically, the metallic layer is deposited by sputtering, and the thickness thereof is selected so that the optical density of the layer, to white light, is in the approximate range of 0.1 to 0.8. Typical thicknesses are less than a micron.

The second layer of material preferably comprises an ultraviolet absorbing dye dissolved in a polymer matrix material. The second layer has a thickness which is generally in the range of 1 to 10 microns. There are a number of ultraviolet absorbing dyes known and available to those of skill in the art, which may be employed in the practice of the present invention. However, the assignee of this invention has discovered a unique class of ultraviolet absorbing dyes which have very high absorptions for ultraviolet light but which are relatively transparent to visible wavelengths and infrared wavelengths. In addition, these dyes are very stable under high levels of illumination, and also have very good thermal stability and good stability to ambient atmospheric conditions. This preferred group of dyes comprises azo dyes.

As is known in the art, azo dyes can be formed by the coupling of a diazonium salt with another organic molecule, typically an aromatic molecule. One particular diazonium salt which may be employed to form azo dyes having utility in the present invention is represented by Formula I hereinbelow:

FORMULA I

Another diazonium salt having utility in the practice of the present invention is defined by Formula II hereinbelow:

FORMULA II

In both instances, R equals hydrogen or an alkyl group, most preferably methyl, ethyl, or propyl; Y is a halogen, preferably chlorine or fluorine; and X may be any anion, and most typically comprises a halogen, $NO_3^-$, $HSO_4^-$, $BF_4^-$, $PF_6^-$, and the like.

The coupler molecule which reacts with the diazonium salt to form the diazo dye is preferably an aromatic molecule. Some particularly preferred couplers are represented by Formulas III and IV hereinbelow:

FORMULA III

FORMULA IV

In the foregoing, R is hydrogen or alkyl as above, and for these particular couplers R is most preferably hydrogen or a low molecular weight alkyl; n is 0 or a whole number, and is most preferably 1, 2 or 3.

Azo dyes made in accord with the foregoing structural formulas are easily synthesized, stable on storage, highly absorbing of ultraviolet wavelengths, and relatively poor absorbers of visible and near infrared wavelengths. Some particular dyes which may be utilized in the present invention will be described hereinbelow, but it is to be understood that such examples are illustrative of the present invention, and not limitations upon the practice thereof A first dye having utility in the present invention is prepared from a diazonium salt of the general Formula I herein above, in which the halogen, Y, is chlorine and both R groups are ethyl. The cation of this salt may be referred to as p-diazonium-o-chloro-N, N-diethylaniline. Reaction of this ion with a coupler of the general Formula III in which both R groups are hydrogen (2, 2'-dihydroxy-biphenyl), couples the diazonium nitrogen to one of the aromatic rings to liberate HX and form the resultant azo dye. The resultant dye has a pale yellow color to the eye and a high absorption in the ultraviolet portions of the spectrum, typically below 360 nanometers.

If the coupling reaction is carried out with a coupler of the general Formula IV in which both R's are hydrogen and n is 2 (beta-resorcylic acid-ethanolamide), the resultant dye will have a brownish color to the eye, and will be primarily absorbing of light in the visible portions of the spectrum.

A similar group of compounds were prepared by reacting a diazonium salt of the type represented by Formula I in which both of the R groups are methyl, with the afore-described couplers. The resultant diazo dyes were generally similar to those obtained through the use of the diethyl compound.

Another group of diazo dyes were prepared from a diazonium salt of the type represented by Formula II, in which the R group para to the sulfur is methyl and the remaining R groups which are attached to the oxygens, are both ethyl. The corresponding cation may be referred to as 1-diazonium-2, 5-diethoxy-4-tolylmercapto-benzene. Coupling of this diazonium ion with either of the aforedescribed couplers produces an azo dye having a high absorption in the ultraviolet portions of the spectrum.

The dyes are disposed in a polymeric matrix. While it is possible to react the diazonium salt with the coupler in the matrix to form the dye in situo, it is generally preferable to preform the dye in a separate synthesis step, and then incorporate that dye into the matrix. There are a variety of matrix materials which may be employed in the present invention. A matrix material should be compatible with the dye, have good adhesion to the underlying first layer of the material and should also be relatively transparent to visible, near ultraviolet and near infrared wavelengths. One particularly preferred group of matrix materials comprises cellulose acetate polymers with cellulose acetate propionate (CAP) being a particularly preferred material. CAP has good film forming properties, good broad spectrum transparency, and adheres very well to a titanium sublayer. In addition, CAP breaks cleanly from the substrate when the subjacent metal layer is disrupted, thereby producing an accurate, high resolution image. Other polymers such as cellulose acetate butyrate (CAB), cellulose acetate and vinyl materials may be similarly employed.

In one particularly preferred embodiment of the present invention, the polymer for the second layer comprises a mixture of two different viscosities of CAP, with the first material comprising a relatively low viscosity polymer and the second a higher viscosity polymer. As is known in the art, viscosity of polymers is often quantified by noting the time it takes for a given amount of a standard solution of a polymer to pass through a standard size opening in a container. One preferred mix of resins comprises a 0.5 second resin and a 20 second resin used in equal weight amounts and such resins are available from the Eastman Chemical Company under the designation CAP 504-0.2 and CAP 482-20.

The first layer of the material should include sufficient ultraviolet dye to give it a fairly high optical density in the ultraviolet portion of the spectrum, while avoiding undue absorption in the infrared and visible portions of the spectrum. Typical loadings of dye comprise approximately 10–100 milligrams of dye per $cm^2$. Coating of the second layer is typically accomplished by extrusion coating from a solvent based solution of polymer and dye; although, other coating techniques such as rod coating, spin coating, blade coating, dip coating and the like may be employed.

Yet other embodiments of the present invention may be implemented. For example, the first layer of material need not be fabricated from a metal, but other disruptable materials such as organic materials may be similarly employed. Also, the second layer may include absorbing species different than those dyes described herein. It is also to be understood that other layers of materials such as anti-reflective layers, protective layers, and the like may be incorporated in the medium of the present invention, as is known in the art. These layers may be disposed between the first and second layers, which will still be considered to be in a superposed relationship; or, they may be otherwise disposed.

Figure 10:
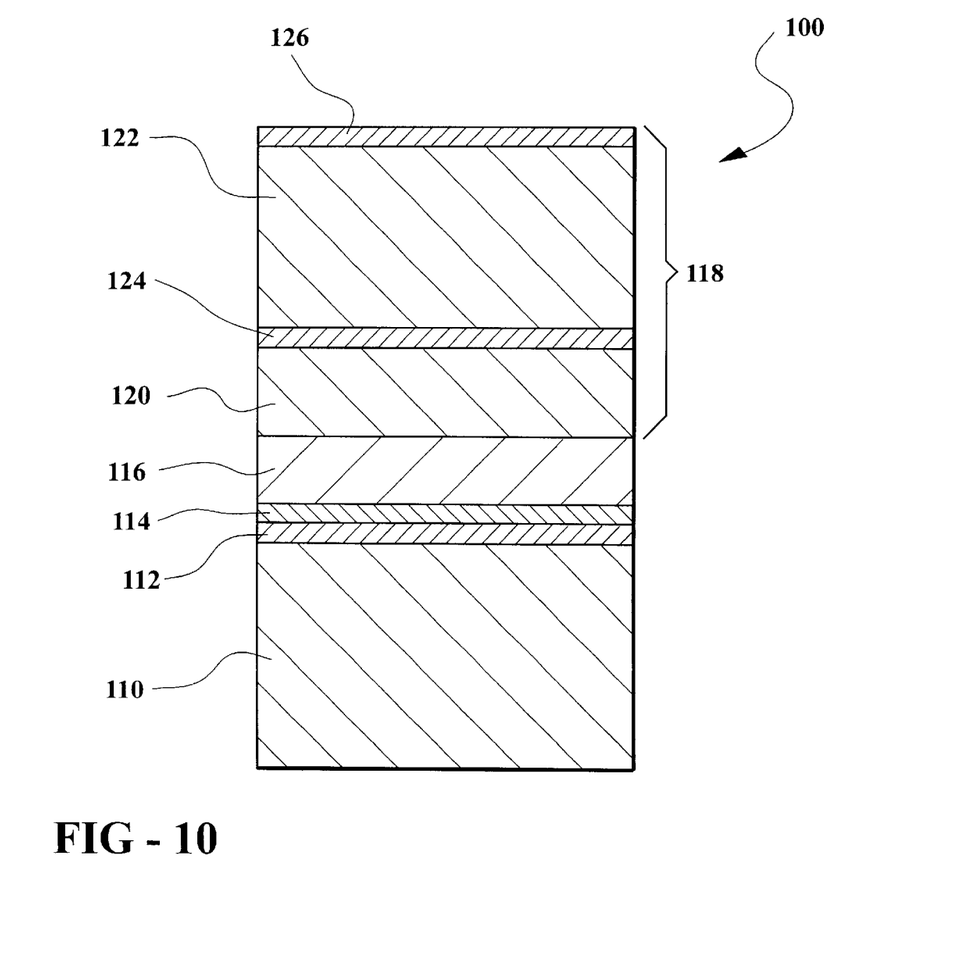
FIG. 10 is a cross-sectional view of another embodiment of imaging medium structured in accord with the principles of the present invention.

Referring now to FIG. 10, there is shown one preferred commercial embodiment of the present invention. FIG. 10 illustrates a specific direct write film 100. The film includes a substrate 110 which is preferably fabricated from a polyester material, such as PET, having good optical clarity. Typically, the substrate is fabricated from a relatively thick body of material so as to provide sufficient rigidity during handling and use, and it has been found that 650 gauge polyester is advantageous in the practice of the present invention. Disposed atop the substrate 110 is a relatively thin layer of titanium metal 112. This layer functions as the first layer of the film system of the present invention, and is readily disrupted by laser radiation. Typically, the thickness of this layer 112 is less than 1 micron, and is selected so that its white light optical density is approximately 0.5–0.8. Disposed atop the first, metallic layer 112 is a heat dispersing undercoat layer 114. This layer has a thickness of approximately 2 microns, and as described above, functions to minimize the formation of defects such as trapezoid edges, chips and the like. This layer is preferably fabricated from hydrolyzed polyvinyl acetate. Disposed atop the undercoat layer 114 is a dye coat layer 116. This layer functions as the second layer of the film, and includes an ultraviolet absorbing dye therein. The thickness of the dye coat layer is approximately 5 to 6 microns.

The FIG. 10 embodiment further includes a cover sheet assembly 118 disposed upon the dye coat layer 116. The cover sheet assembly 118 is (comprised of a body of adhesive material 120 retained upon a backing sheet 122. In the illustrated embodiment, the backing sheet 122 includes a subbing layer 124 thereupon, which facilitates bonding of the adhesive body 120 thereto. Although optional, the cover sheet 118 preferably includes an antistatic coating 126 on its top surface, and as is known in the art, this coating 126 serves to prevent static buildup on the film which would result in the collection of dust.

The backing sheet 122 is, in this embodiment, preferably fabricated from polyester material such as PET having a thickness of approximately 92 gauge. The adhesive body 120 may be any commercially available adhesive having a moderate tackiness with regard to the dye coat layer 116. The subbing layer 124 is preferably included to assure that the adhesive body 120 bonds more tightly to the backing layer 122 than it does to the dye coat layer 116. The composition of the subbing layer 124 will depend upon the nature of the adhesive body 116 and the backing layer 122, and commercial materials are readily available for this purpose.

Some particular versions of the FIG. 10 film may be fabricated utilizing an undercoat prepared by coating a weight solution of 10% hydrolyzed polyvinyl acetate in 45% methanol and 45% ethyl acetate.

Another undercoat composition comprises, by weight, 25% of a hydrolyzed polyvinylacetate emulsion sold by the Morton Chemical Company under the designation Morton Polymer 10, dissolved in 50% deionized water and 25% isopropanol.

One preferred dye coat layer is prepared by rod coating a solution of 395.81 grams acetone, 319.04 grams methanol, 193.42 grams of a propylene glycol methyl ether solvent sold under the designation Dowanol PM, 28.91 grams of cellulose acetate propionate 0.5 sec, sold by the Eastman Chemical Company under the designation CAP 504-0.2, 28.91 grams of cellulose acetate propionate, 20 sec, sold by the Eastman Chemical Company under the designation CAP 482-20,30.91 grams of an ultraviolet absorbing dye designated LPA dye T-113, which is prepared by reacting the diazonium salt of Formula I with the coupler of Formula III and 0.3 grams of a polyether modified dimethylpolysiloxane copolymer sold by the Byk Chemie chemical company under the designation BYK331. This material is rod coated atop the undercoat layer to a thickness of approximately 5–6 microns.

An alternative dye coat formulation which is suited for extrusion coating is comprised of, on a weight basis, 382 grams acetone, 310 gram methanol, 188 grams Dowanol PM, 38 grams CAP (0.5 sec), 38 grams CAP (20 sec), 40 grams LPA dye T-113, and 0.4 grams BYK331. This mixture is extrusion coated to a thickness of approximately 5–6 microns.

One preferred adhesive formulation for the FIG. 10 embodiment comprises a contact adhesive sold by the Morton Chemical Company under the designation Morstick 220. 90 grams of this adhesive is mixed with 10 grams of water, and coated onto a 92 gauge pretreated polyester sheet to a thickness of approximately 12 microns.

Thus, is to be understood that the foregoing drawings, discussion and description are illustrative of particular embodiments of the present invention, but are not meant to be limitations upon the practice thereof. It is the following claims, including all equivalents, which define the scope of the invention.

What is claimed is:

1. A direct write imaging film comprising:

a substrate;

a first layer of a first material disposed upon said substrate; and a second layer of a second material disposed in a superposed relationship with said first layer;

wherein the first layer has a higher absorbance for a first wavelength of light than it does for a second wavelength of light, which second wavelength of light is shorter than said first wavelength of light; said second layer has a lower absorbance for said first wavelength of light than does said first layer, and higher absorbance for said second wavelength of light than does said first layer, and wherein the first layer is capable of being disrupted by said first wavelength of light so as to disrupt a superadjacent portion of said second layer such that said portion is no longer adherent to the substrate.

2. The direct write imaging film of claim 1, wherein said first layer comprises a layer of metal.

3. The direct write imaging film of claim 1, wherein said second layer includes an ultraviolet absorbing dye therein.

4. The direct write imaging film of claim 3, wherein said ultraviolet absorbing dye is an azo dye.

5. The direct write imaging film of claim 4, wherein said azo dye is formed by the reaction of an aromatic coupling agent with a diazonium salt selected from the group consisting of:

-continued wherein R is hydrogen or an alkyl, Y is a halogen and X is an anion.

6. The direct write imaging film of claim 5, wherein said aromatic compound is selected from the group consisting of:

wherein R is hydrogen or an alkyl and n is 0 or a positive integer.

7. The direct write imaging film of claim 3, wherein said second layer comprises a polymeric matrix having said ultraviolet absorbing dye dissolved therein.

8. The direct write imaging film of claim 1, further including a heat dispersion layer interposed between said first layer and said second layer.

9. The direct write imaging film of claim 8, wherein said heat dispersion layer comprises a layer of a polymeric material.

10. The direct write imaging film of claim 9, wherein said polymeric material is hydrolyzed polyvinyl acetate.

11. The direct write imaging film of claim 1, wherein said first layer of said first material comprises a layer of titanium.

12. The direct write imaging film of claim 11, wherein said layer of titanium has an optical density in the range of 0.1 to 0.8.

13. The direct write imaging film of claim 7, wherein said polymeric matrix comprises a cellulose acetate polymer.

14. The direct write imaging film of claim 13, wherein said cellulose acetate polymer comprises a mixture of at least two cellulose acetate propionate polymers having different viscosities.

15. The direct write imaging film of claim 13, wherein said cellulose acetate polymer is selected from the group consisting of cellulose acetate, cellulose acetate propionate, cellulose acetate butyrate, and combinations thereof.

16. The direct write imaging film of claim 1, further including a cover sheet assembly, said cover sheet assembly including a layer of adhesive which is in contact with said second layer.

17. A direct write imaging film comprising:

a substrate;

a first layer of a first material disposed upon said substrate; and a second layer of a second material disposed in a superposed relationship with said first layer;

wherein the first layer has a higher absorbance for a first wavelength of light than it does for a second wavelength of light, which second wavelength of light is shorter than said first wavelength of light; said second layer has a lower absorbance for said first wavelength of light than does said first layer, and higher absorbance for said second wavelength of light than does said first layer, and wherein the first layer is capable of being disrupted by said first wavelength of light so as to disrupt a superadjacent portion of said second layer such that said portion is no longer adherent to the substrate; and a cover sheet assembly which includes a body of adhesive disposed atop the second layer, and a backing sheet which is disposed atop said body of adhesive.

18. A direct write imaging film comprising:

a substrate;

a first metal layer disposed upon said substrate; and a second layer of a second material disposed in a superposed relationship with said first layer;

wherein the first layer has a higher absorbance for a first wavelength of light than it does for a second wavelength of light, which second wavelength of light is shorter than said first wavelength of light; said second layer has a lower absorbance for said first wavelength of light than does said first layer, and higher absorbance for said second wavelength of light than does said first layer, and wherein the first layer is capable of being disrupted by said first wavelength of light.

19. A direct write imaging film comprising:

a substrate;

a first layer of a first material disposed upon said substrate; and a second layer of a second material including an ultraviolet absorbing dye disposed in a superposed relationship with said first layer;

wherein the first layer has a higher absorbance for a first wavelength of light than it does for a second wavelength of light, which second wavelength of light is shorter than said first wavelength of light; said second layer has a lower absorbance for said first wavelength of light than does said first layer, and higher absorbance for said second wavelength of light than does said first layer, and wherein the first layer is capable of being disrupted by said first wavelength of light.

* * * * *